United States Patent [19]

Matsugu et al.

[11] Patent Number: 5,162,656

[45] Date of Patent: Nov. 10, 1992

[54] POSITION DETECTING DEVICE EMPLOYING MARKS AND OBLIQUE PROJECTION

[75] Inventors: Masakazu Matsugu, Atsugi; Kenji Saitoh; Shigeyuki Suda, both of Yokohama; Ryo Kuroda, Atsugi; Yukichi Niwa, Narashino; Noriyuki Nose, Machida, all of Japan

[73] Assignee: Canon Kabushiki Kaisha, Tokyo, Japan

[21] Appl. No.: 841,790

[22] Filed: Mar. 2, 1992

Related U.S. Application Data

[63] Continuation of Ser. No. 714,349, Jun. 12, 1991, abandoned, which is a continuation of Ser. No. 608,630, Nov. 6, 1990, abandoned, which is a continuation of Ser. No. 310,626, Feb. 15, 1989, abandoned, which is a continuation-in-part of Ser. No. 271,314, Nov. 15, 1988, abandoned.

[30] Foreign Application Priority Data

Feb. 16, 1988 [JP] Japan .................................. 63-33204

[51] Int. Cl.⁵ .................................... G01N 21/86
[52] U.S. Cl. ................................ 250/548; 356/401
[58] Field of Search ............. 250/548, 557; 356/400, 356/401

[56] References Cited

U.S. PATENT DOCUMENTS

| | | | |
|---|---|---|---|
| 4,037,969 | 7/1977 | Feldman et al. | 356/172 |
| 4,211,489 | 7/1980 | Kleinknecht et al. | 250/237 G |
| 4,326,805 | 4/1982 | Feldman et al. | 356/399 |
| 4,340,305 | 7/1982 | Smith et al. | 356/356 |
| 4,360,273 | 11/1982 | Thaxter | 356/354 |
| 4,631,416 | 12/1986 | Trutna | 250/548 |
| 4,641,035 | 2/1987 | Suzuki et al. | 356/400 |
| 4,771,180 | 9/1988 | Nomura et al. | 250/548 |
| 4,779,001 | 10/1988 | Makosch | 250/548 |

FOREIGN PATENT DOCUMENTS 53-1344457 11/1978 Japan .

Primary Examiner—David C. Nelms
Attorney, Agent, or Firm—Fitzpatrick, Cella, Harper & Scinto

[57] ABSTRACT

A device for detecting positional relationship between a first and second objects in a predetermined direction is disclosed. The device includes light source for projecting light upon the first object so that the light incident on the first object is deflected thereby and emanates therefrom in a direction perpendicular to the predetermined direction; a light receiving portion disposed in a direction in which the light having been deflected perpendicularly to the predetermined direction and having been deflected again by the second object advances, the light receiving portion being operable to detect the position of incidence of the light thereupon, wherein the position of the light upon the light receiving means is changeable with the position of incidence of the light upon the second object; and a detecting system for detecting the positional relationship between the first and second objects in the predetermined direction, on the basis of the detection by the light receiving portion.

22 Claims, 13 Drawing Sheets

POSITION DETECTING DEVICE EMPLOYING MARKS AND OBLIQUE PROJECTION

This application is a continuation of application Ser. No. 07/714,349 filed Jun. 12, 1991, now abandoned, which was a continuation of application Ser. No. 07/608,630 filed Nov. 6, 1990, now abandoned, which was a continuation of application Ser. No. 07/310,626 filed Feb. 15, 1989, now abandoned, which was a continuation-in-part of application Ser. No. 07/271,314 filed Nov. 15, 1988, now abandoned.

FIELD OF THE INVENTION AND RELATED ART

This invention relates generally to an alignment system for correctly positioning an object. More particularly, the invention is concerned with position detecting method and apparatus suitably usable in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer.

In exposure apparatuses for use in the manufacture of semiconductor devices, the relative alignment of a mask and a wafer is one important factor in respect to ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. Nos. 4,037,969 and 4,514,858 and Japanese Laid-Open Patent Application, Laid-Open No. Sho 56-157033, wherein so-called zone plates ar used as alignment patterns upon which light is projected and wherein the positions of light spots formed on a predetermined plane by lights from the illuminated zone plates are detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates.

In FIG. 1, a parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 and the wafer 60.

FIG. 2 illustrates an imaging relationship of lights from the mask alignment pattern 68a and the wafer alignment pattern 60a shown in FIG. 1.

In FIG. 2, a portion of the light divergingly advancing from the point 78 is reflectively diffracted by the mask alignment pattern 68a and forms a spot 78a of focused light at or adjacent to the point 78, the spot representing the mask position. Another portion of the light passes through the mask 68 in the form of a zero-th order transmission light and is projected upon the wafer alignment pattern 60a on the wafer 60 surface with its wavefront being unchanged. The incident light is reflectively diffracted by the wafer alignment pattern 60a and then passes again through the mask 68 in the form of a zero-th order transmission light, and finally is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot 78b formed by the wafer alignment pattern 60a in the described manner represents a deviation $\Delta\sigma'$, in the plane perpendicular to the optical axis containing the point 78, of an amount corresponding to the amount of deviation $\Delta\sigma$ of the wafer 60 with respect to the mask 68.

In such a device described above, however, there are formed a spot of focused light representing the position of a wafer and a spot of focused light representing the position of a wafer, independently from each other. These separate light spots have to be detected respectively to determine the relative position of the mask and the wafer. Thus, the process is complicated.

Another example of detecting the relative position of a mask and a wafer by using a physical optic element such as a Fresnel zone plate is proposed in U.S. Pat. No. 4,311,389. The principle of this proposed method is illustrated in FIG. 3.

In FIG. 3, a linear-pattern Fresnel zone plate 68b is provided on a mask 68. This zone plate is formed by elongated non-transparent portions and elongated transparent portions which are arrayed alternately, so that the zone plate has a light converging function only in the x direction. On the other hand, a diffraction grating 60b is provided on a wafer 60, which comprises elements arrayed in the y direction. The Fresnel zone plate 68b functions to converge a received light in the x direction to focus the same on the wafer 60 surface into a slit-like shape having a longitudinal direction parallel to the y direction. If the focused light impinges on the diffraction grating 60b on the wafer 60 surface, diffraction light 69 is produced which is detected by a detector, not shown. An unshown illumination system is arranged to scan the Fresnel zone plate 68b with light and the unshown detector detects the variation in intensity of the received light, coming from the wafer. Namely, on the basis of a change in the intensity of light caused when the focused light from the zone plate 68b impinges exactly on the diffraction grating 60b, as detected by the detector, the position of the diffraction grating 60b relative to the Fresnel zone plate 68b, namely, the relative position of the mask 68 and the wafer 60 is detected.

In this detecting method, the variation in light intensity as detected by the detector represents the positional relationship between the mask 68 and the wafer 60. In other words, only by use of one detector, the relative position of the mask 68 and the wafer 60 may be detected. As a result, the structure may be simple. If, however, the spacing or gap g between the mask 68 and the wafer 60 changes for some reason, the light converged by the Fresnel zone plate 68b is not focused just upon the wafer 60. This results in a decrease in the light intensity, per unit area, of the slit-like light spot illuminating the diffraction grating 60b. Also, the area of illumination increases. As a consequence, the intensity variation as can be detected by the detector has low contrast and, additionally, the intensity variation occurs in a wide range. This necessarily results in deteriorated detection accuracies and, therefore, a failure of high-precision detection of the relative position of the mask and the wafer.

SUMMARY OF THE INVENTION

It is accordingly an object of the present invention to provide a position detecting device, wherein the relative position of a first and second objects can be detected with high precision and with a simple and compact structure, the precision being not easily affected by any change in the gap or spacing between the first and second objects.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 13A and 13B illustrates a fifth embodiment of the present invention, wherein FIG. 13A is a schematic side view and FIG. 13B is a schematic front view.

DESCRIPTION OF THE PREFERRED EMBODIMENTS

In one preferred embodiment, while details of which will be described later, for relative positioning of a first and second objects disposed opposed to each other, a first physical optic element is formed on the first object for positioning of the same at least in one direction and a second physical optic element is formed on the second object for positioning of the same at least in one direction. Light projecting means projects a light so that it is incident upon the second physical optic element on the second object in a direction inclined with respect to a normal of the second physical optic element. The light is deflected by the second physical optic element in a direction perpendicular to the direction of positioning, the deflected light being incident upon the first physical optic element on the first object. By detecting light emanating from the first physical optic element, the first and second objects can be relatively positioned.

For the detection of light, the center of gravity of light incident upon an appropriate sensing means may be detected.

The term "center of gravity of light" means such a point that, when in the cross-section of the light a position vector of each point in the section is multiplied by the light intensity of that point and the thus obtained products are integrated over the entire section, the integrated value has a "zero vector".

Figure 1:
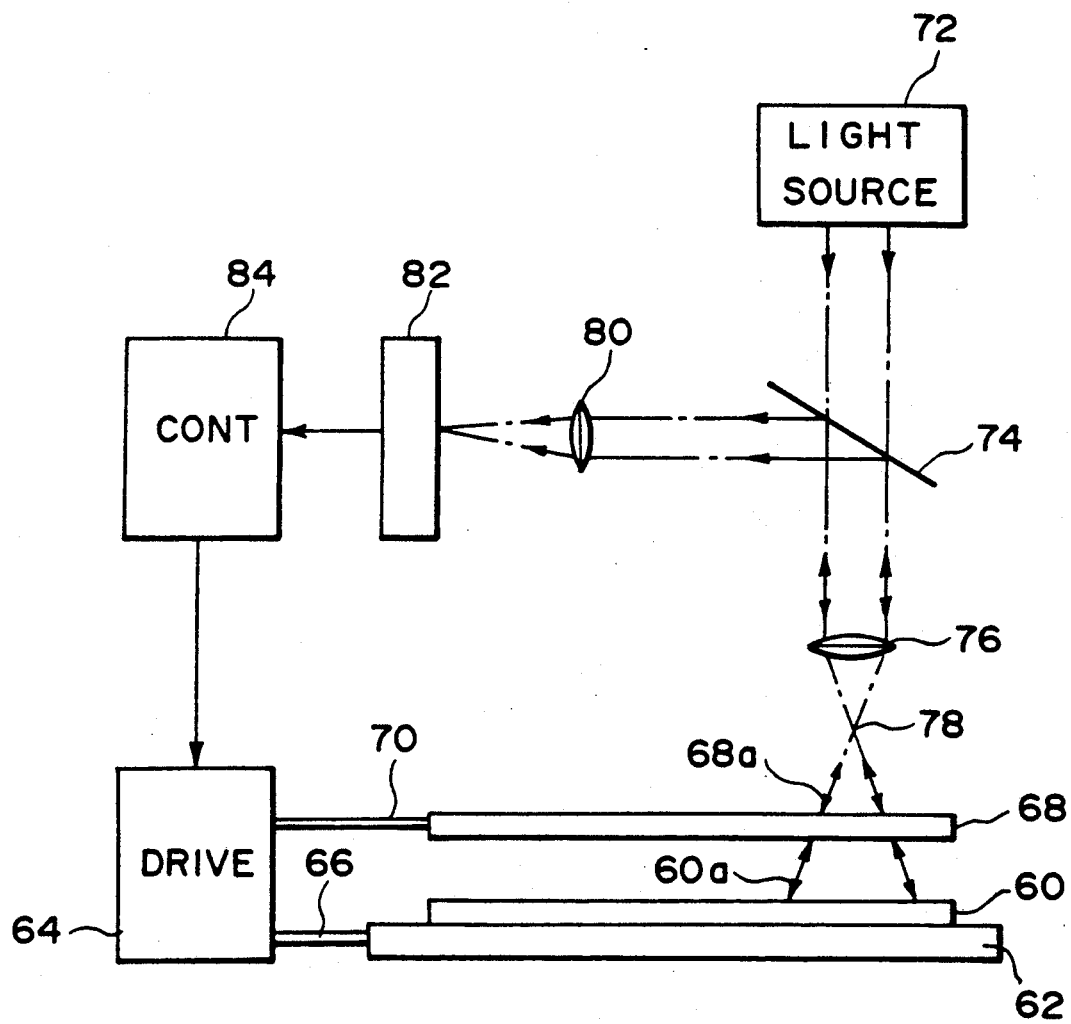
FIGS. 1 and 2 are schematic views for explicating a known type alignment system using zone plates.
Figure 2:
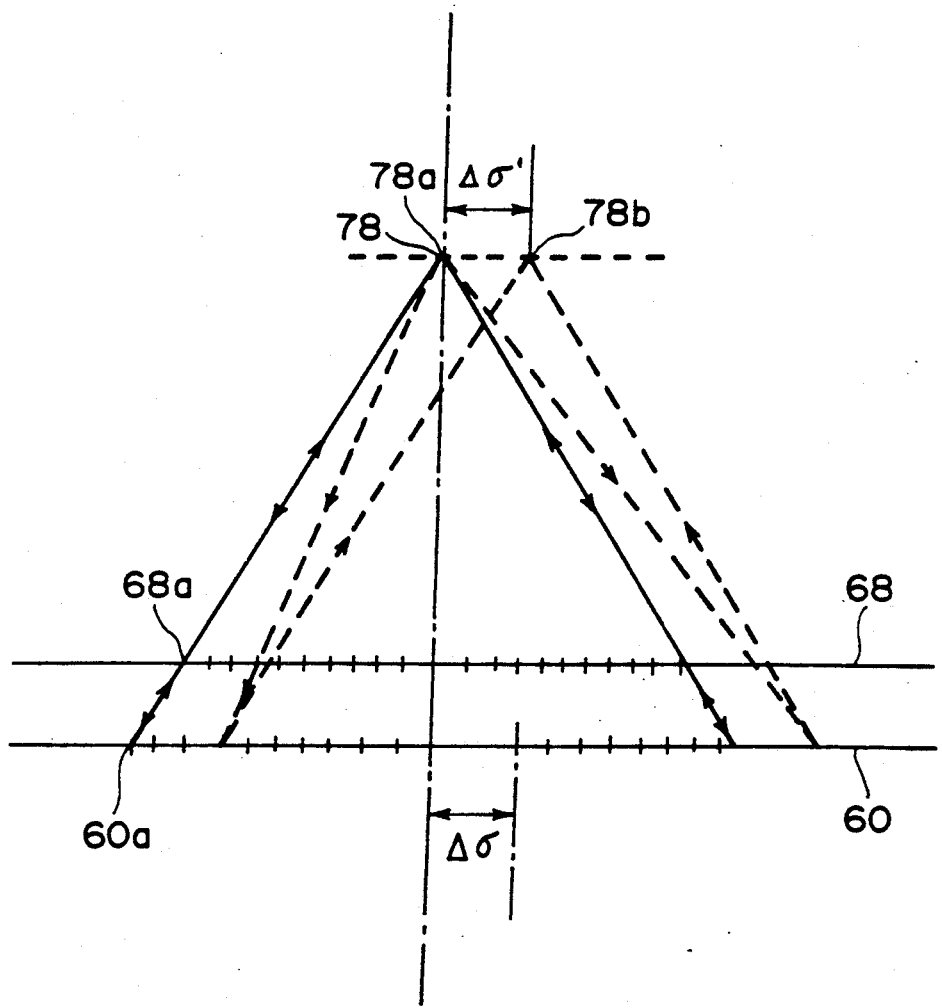
Figure 3:
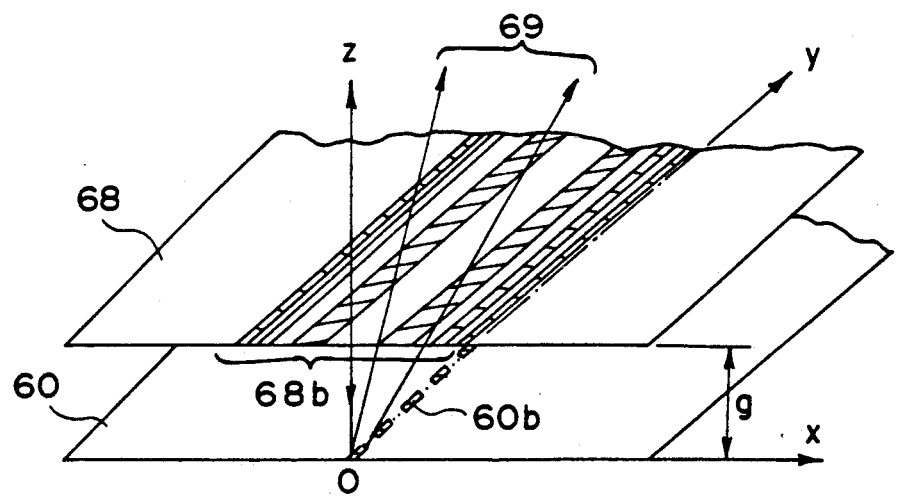
FIG. 3 is a schematic view for explicating a position detecting device of a known type, using a zone plate.
Figure 4A:
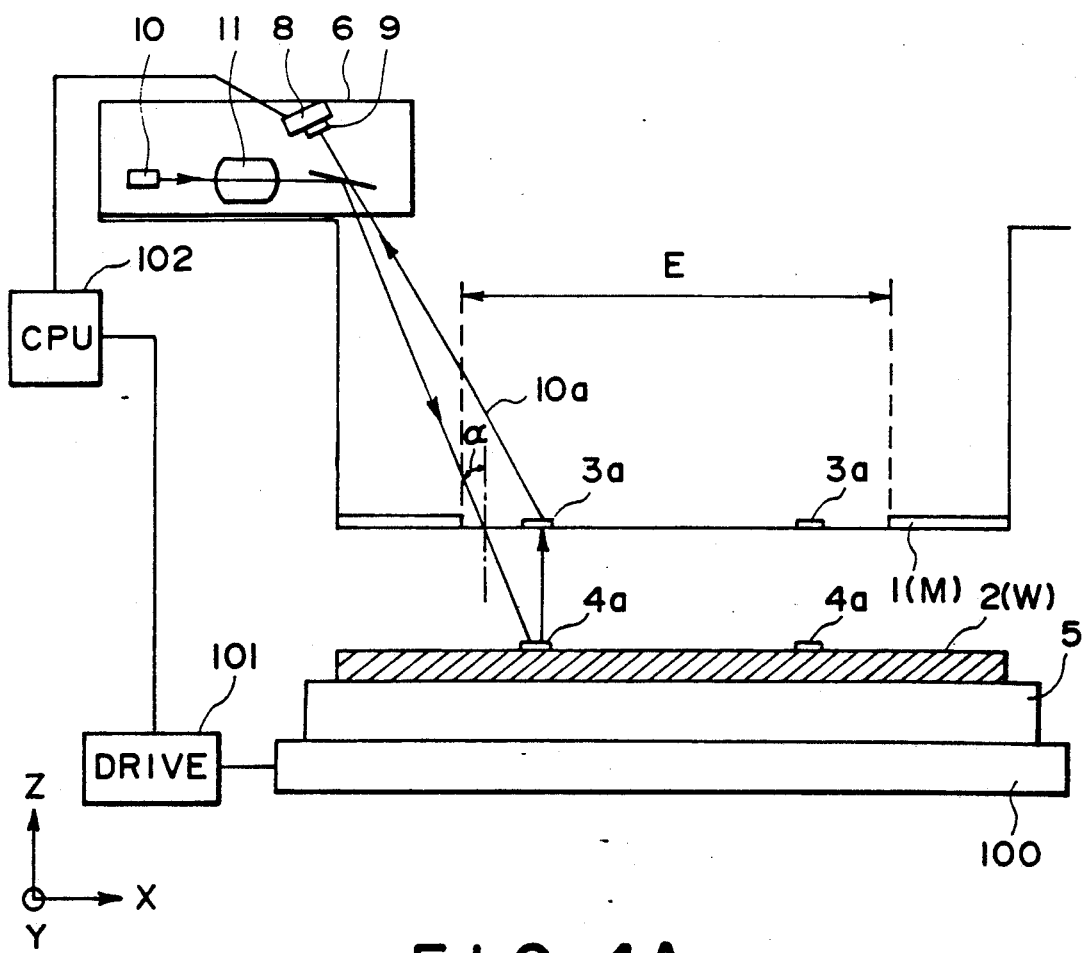
FIG. 4A is a schematic illustration of a position detecting device according to a first embodiment of the present invention.

FIG. 4A schematically illustrates a first embodiment in which the invention is applied to a semiconductor device manufacturing exposure apparatus of proximity exposure type. In this embodiment, light emanating from a light source 10 is collimated into a parallel light by means of a projecting lens system 11. After being reflected by a half mirror 12, the parallel light passes through a first object 1 such as a mask M surface, for example, and thereafter it is projected in an inclined direction upon a second physical optic element 4a which may comprise, for example, a grating lens that is one type of Fresnel zone plate.

The second physical optic element 4a has a light converging function and operates to emit a reflection light in a direction of a normal (+z direction) of the surface of a second object 2 which may be a wafer, for example. The light emanating from the second physical optic element 4a is incident upon a first physical optic element 3a formed in a portion of the surface of the first object 1 (e.g. a mask surface), spaced by a predetermined distance from the second physical optic element 4a. The first physical optic element 3a has a light converging function and operates to emit a received light in a direction to an alignment head, generally denoted at 6, and also to collect the same upon a detecting surface 9 of a detector 8, the light passing through the half mirror 12. In this embodiment, the wafer 1 is placed on a wafer chuck 5, for example, which is adapted to hold a wafer by attraction. The alignment head 6 accommodates therein various components necessary for the alignment purpose. Reference character E denotes an exposure region through which a circuit pattern formed on the mask can be transferred onto a wafer.

As illustrated, the mask 1 and the wafer 2 are so held that a spacing or gap of a value which is within a predetermined range is defined therebetween.

X-Y stage 100 is operable to move the wafer, being attracted to the wafer chuck 5, in X and Y directions. Stage driver 101 is adapted to drive the X-Y stage 101 in the X and Y directions. Central processing unit (CPU) 102 is operable in response to output signals from the detector 8 to produce and supply instruction signals to the stage driver 101 to move the X-Y stage 100 so as to align the wafer 2 with the mask 1. The X-Y stage 100 is also effective to move the wafer 4 in the z direction to a predetermined position, to thereby set a predetermined gap between the mask and the wafer.

While in this embodiment the wafer 2 is displaced for alignment purpose, a suitable mask chuck moving mechanism may be provided to displace the mask 1 for this purpose.

The X-Y stage 100 includes a fine-motion wafer stage which can be driven by a piezoelectric drive mechanism, and a rough-motion wafer stage that can be driven by a stepping motor drive mechanism. The stage driver 101 includes such a piezoelectric drive mechanism and such a stepping motor drive mechanism. For a minute displacement of a wafer, the CPU 102 supplies instruction signals to the piezoelectric drive whereas, for a relatively large distance movement, it supplies instruction signals to the stepping motor drive.

For convenience, hereinafter, the first physical optic element $3a$ will be mainly referred to as a mask grating lens; the second physical optic element $4a$ will be mainly referred to as a wafer grating lens; while the first object will be mainly referred to as a mask; and the second object will be mainly referred to as a wafer.

In this embodiment, as described, each alignment pattern on the wafer 2 surface can be provided by a grating lens (one type of Fresnel zone plate) having a predetermined focal length, by which a light for the alignment purpose being projected from the alignment head 6 upon the wafer 2 surface at an incline is deflected in the direction of normal (+Z direction) to the wafer 2 surface and is collected at a predetermined position (e.g. $Z=+276.0$ microns).

In this embodiment, the angle $\alpha$ of the inclined projection of light upon the mask 1 surface is preferably within the following range:

$$10<\alpha<80 \text{ (deg)}$$

On the other hand, an alignment pattern $3a$ on the mask 1 can be provided by an off-axis type grating lens comprising a pattern which is asymmetrical with respect to the Z axis. For example, this grating lens may be designed to obtain a focal length of 278.78 microns. The grating lens of the mask 1 functions to direct the convergent (divergent) light having been reflectively diffracted by the grating lens on the wafer 2 surface, toward the alignment head.

At this time, the alignment light denoted at $10a$ is influenced by the lens function of the grating lens and then is incident on the photoreceptor 8 accommodated in the alignment head 6. In the first embodiment shown in FIG. 4A, the mask and the wafer can be aligned with respect to the lengthwise direction of a scribe line (i.e. in the Y direction), in which direction each alignment pattern is provided.

Assuming now that the mask 1 and the wafer 2 are relatively deviated by $\Delta\sigma$ in a direction parallel to the mask and the wafer, that the distance from the wafer 2 to the point of convergence of the light having been reflected by the grating lens $4a$ of the wafer 2 is denoted by a, and that the distance to the point of convergence of the light passed through the grating lens $3a$ of the mask 1 is denoted by b, then a deviation or displacement $\Delta\delta$ of the center of gravity of light focused upon the detecting surface 9, from a reference position, can be given by the following equation:

$$\Delta\sigma=\Delta\delta\times(b/a+1) \tag{a}$$

Namely, the deviation $\Delta\delta$ of the center of gravity of light is being magnified at an enlarging magnification which is equal to "$b/a+1$" as compared with the positional deviation $\Delta\sigma$ of the mask and the wafer.

The reference position mentioned above can be predetermined. For example, where the first and second objects are a mask and a wafer to be used with a proximity type exposure apparatus and having first and second physical optic elements $3a$ and $4a$, respectively, first the mask having the first physical optic element $3a$ is held fixed at a suitable position. Then, the wafer having the second physical optic element $4a$ is placed and roughly aligned with respect to the mask by using suitable means. Thereafter, light is projected upon the first and second physical optic elements, and the position of the center of gravity of light upon the detecting surface 9 in that state is detected. Subsequently, while retaining that state, a pattern of the mask is transferred onto the wafer with suitable radiation energy. The thus transferred pattern is observed by use of a microscope or otherwise, and any pattern overlay error is measured. On the basis of the measured error, the wafer is moved so that it is accurately aligned with the mask. Light is again projected upon the first and second physical optic elements of the thus aligned mask and wafer, and the position of the center of gravity of the light upon the detecting surface 9, as defined at that time, is determined as the reference position.

If, as an example, $a=0.5$ mm and $b=50$ mm, the deviation $\Delta\delta$ of the center of gravity is magnified by 101 (one hundred and one) times larger, in accordance with equation (a).

Figure 5:
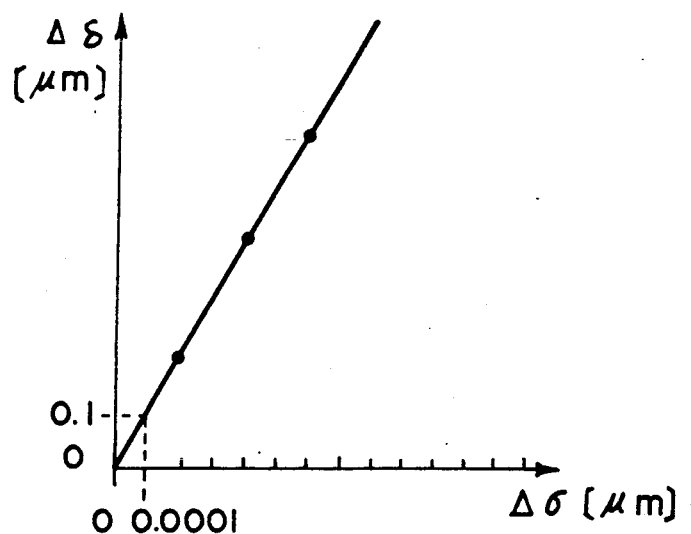
FIG. 5 is a graph showing the relationship between a relative positional deviation and a corresponding shift of center of gravity of light, in the optical arrangement of the FIG. 4A embodiment.

It will be readily understood from equation (a) that the deviation $\Delta\delta$ of the center of gravity and the positional deviation $\Delta\sigma$ at that time are in a proportional relationship such as depicted in FIG. 5. If the detector 8 has a resolution of 0.1 micron, a position resolution of an order of 0.001 micron is obtainable with regard to the positional deviation $\Delta\sigma$.

By moving the second object on the basis of the thus determined positional deviation $\Delta\sigma$, the first and second object can be aligned with high precision.

An alignment process to be adopted in this embodiment of the present invention may be such as follows:

An example is that: The relationship of a deviation signal $\Delta\delta s$ representing the deviation of center of gravity of light on the detecting surface of the detector 8, with respect to the positional deviation $\Delta\sigma$ between two objects, is predetected and a curve showing that relationship is determined preparatorily. Then, from the value of the deviation signal $\Delta\delta s$, the positional deviation $\Delta\sigma$ between these objects is detected and, thereafter, the first or second object is displaced by an amount corresponding to the detected positional deviation $\Delta\sigma$.

A second example is that: From a deviation signal $\Delta\delta s$ representing the deviation of center of gravity and outputted from the detector, the direction that cancels the positional deviation $\Delta\sigma$ is detected. In this direction, the first or second object is displaced, and the above-described process is repeated until the positional deviation $\Delta\sigma$ comes into a tolerable range.

Figure 4B:
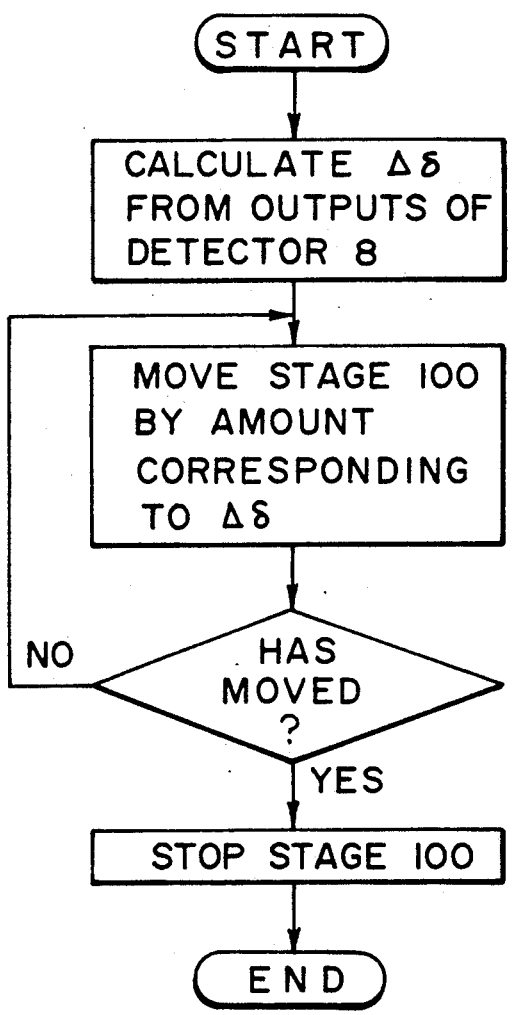
FIGS. 4B and 4C are flow charts, respectively, showing examples of operational procedures that can be adopted in the FIG. 4A embodiment.
Figure 4C:
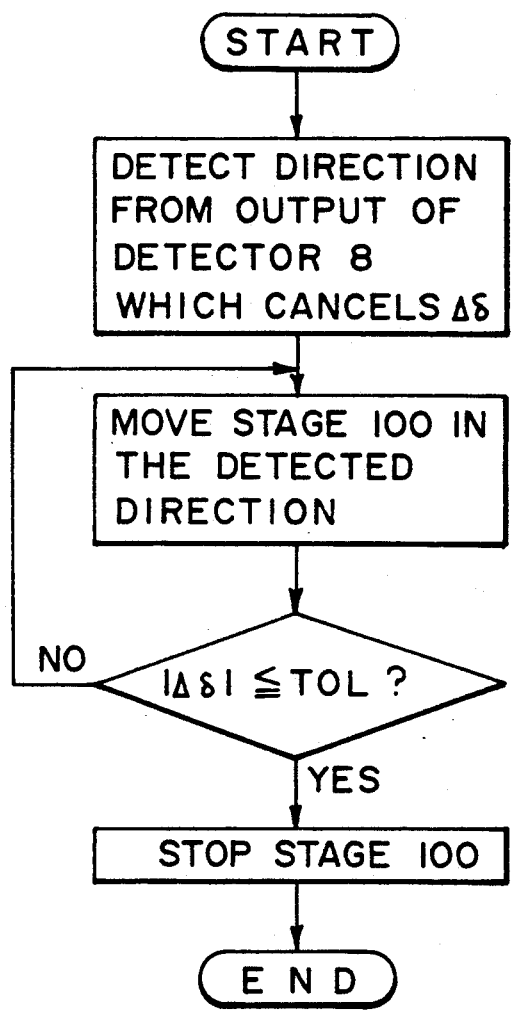

The above-described procedures using the CPU are illustrated in the flow charts of FIGS. 4B and 4C.

As described, the alignment light 10a is reflected by the grating lens 4a of the wafer 2 and then is transmissively diffracted by the grating lens 3a of the mask 1 and, by that, any relative deviation (misalignment) of the optical axes of the grating lenses of the mask and the wafer is magnified by a certain magnification n determined by the grating lens system, the alignment light finally being incident upon the light receiving surface 9 within the alignment head 6. Then, by the photoreceptor 8, the position of the center of gravity of received light is detected.

The focal length of each grating lens may be set, while taking into account the gap between a mask and a wafer at the time of exposure as well as the magnification of the grating lens system desired.

By way of example such a proximity exposure system will no be considered in which the position of the center of gravity of light upon a detecting surface 9 can be detected with a relative positional deviation between a mask and the wafer being magnified by $\times 100$ and with an exposure gap being maintained at 30 microns.

Semiconductor laser is used in that case, for example, to provide an alignment light of a wavelength of 0.83 micron. The alignment light passes through a light projecting lens system 11 in an alignment head 6 and is transformed into a parallel light. The parallel light then passes through a grating lens system comprising two grating lenses which are provided on a wafer 2 and a mask 1, so that the light passes first the wafer and then the mask in sequence. Examples of the refracting power arrangement of such a grating lens system are illustrated in FIGS. 6 and 7.

Figure 6:
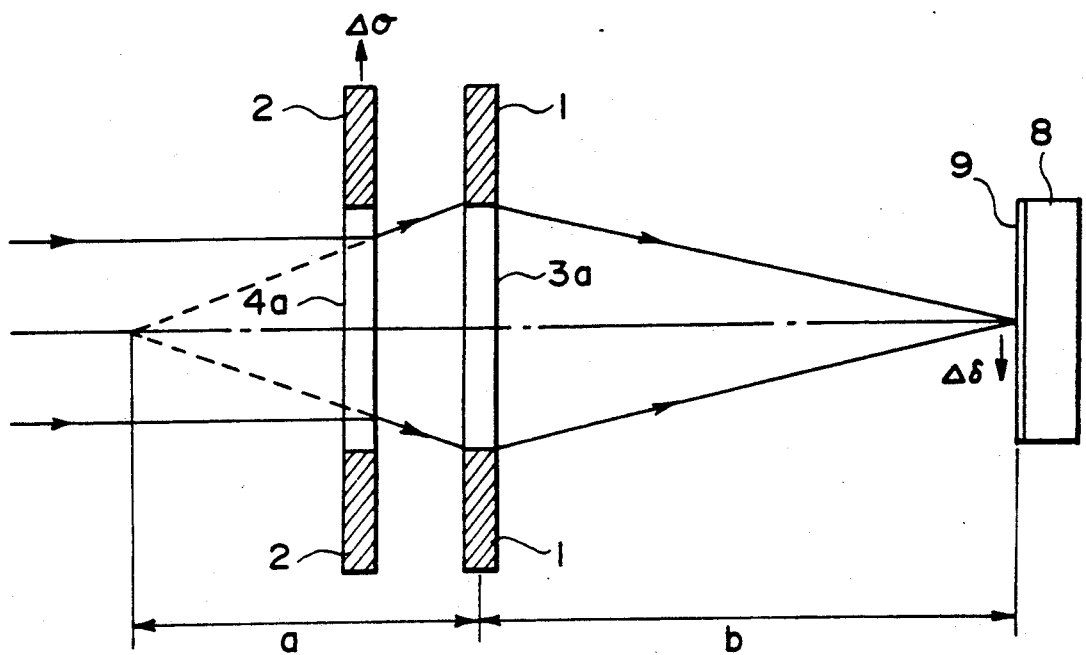
FIGS. 6 and 7 are schematic illustrations exemplifying a refracting power arrangement of two grating lenses, the principle of which can be used in the present invention.
Figure 7:
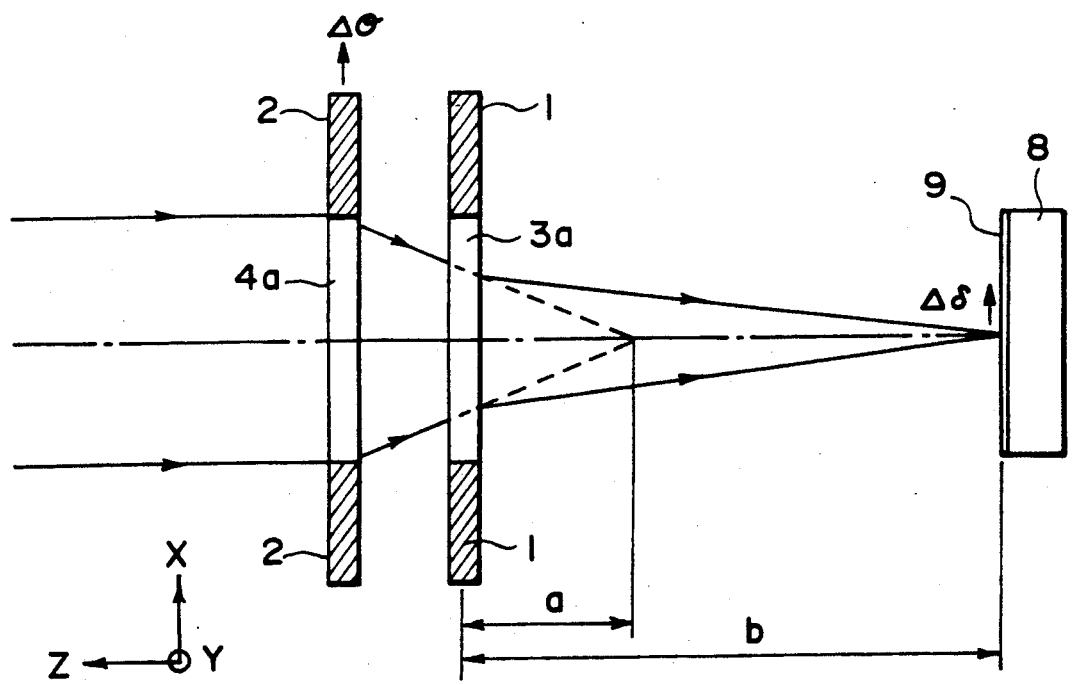

FIG. 6 shows an example wherein a grating lens 4a of a wafer 2 has a negative refracting power, while a grating lens 3a of a mask 1 has a positive refracting power. FIG. 7 shows an example wherein a grating lens 4a of a wafer 2 has a positive refracting power, while a grating lens 3a of a mask 1 has a negative refracting power.

Whether a negative refracting power or a positive refracting power is to be used is determined, depending on whether negative order diffraction light or positive order diffraction light is to be used.

In these particular cases, the grating lens 4a of the wafer 2 has a diameter 300 microns, for example, while the grating lens 3a of the mask 1 has a diameter 280 microns, for example. Disposition of the components and the focal lengths of the optical elements are determined so that the center of gravity of light upon the detecting surface 9 is displaceable with an enlarging magnification of $\times 100$ to a positional deviation between the mask and the wafer (misalignment between optical axes) and that, as a result, the light spot upon the light receiving surface 9 has a diameter (diameter of such area of an Airy disk as having a light intensity higher than the value of $e^{-2}$ of the peak intensity) of about 200 microns.

Optical geometry of a mask grating lens 3a and a wafer grating lens 4a, usable in this embodiment, will now be explained.

Figure 8:
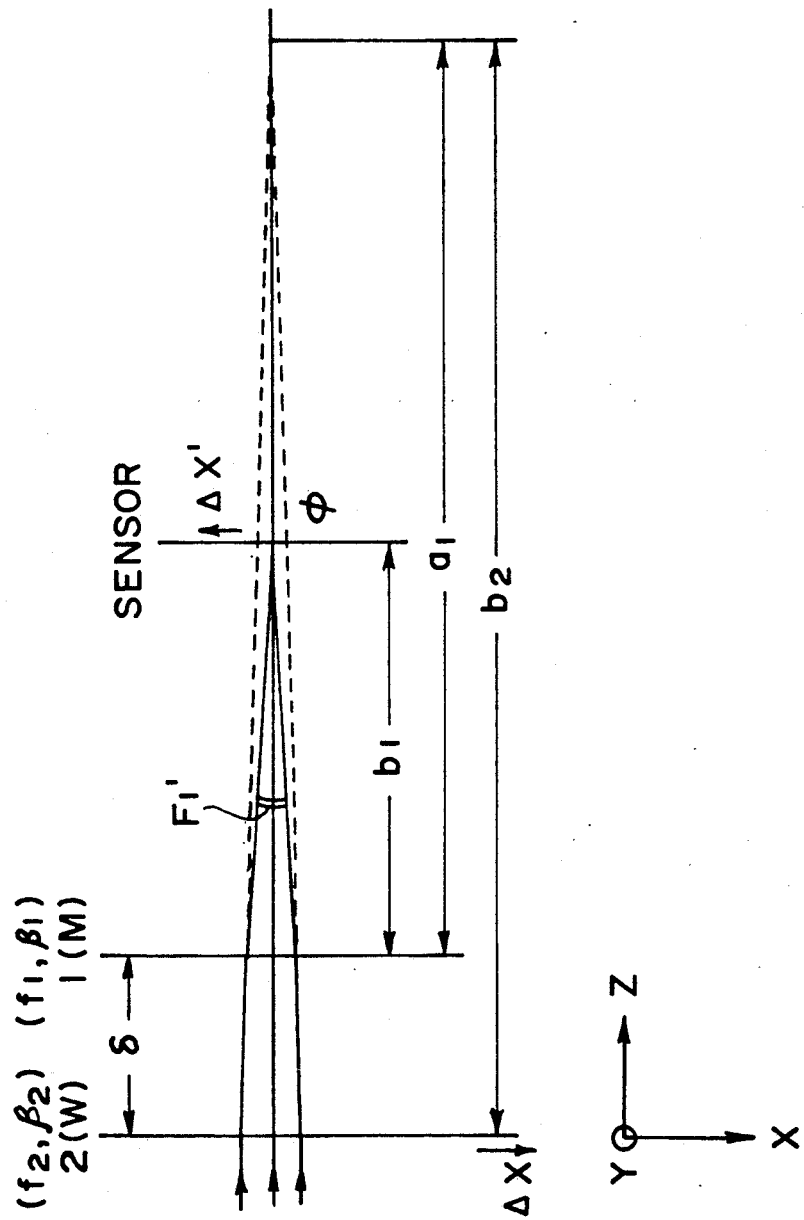
FIG. 8 is a schematic representation explicating the principle of optical function of the device of the FIG. 4A embodiment.

First, a wafer grating lens 4a can be designed so that, when a parallel light of a predetermined beam diameter is incident thereupon at a predetermined angle, the light is focused at a predetermined position. Usually, a pattern of a grating lens 4a may be that of an interference fringe which can be formed on a lens surface in an occasion where mutually coherent light sources are disposed at a light source position (object point) and the position of an image point. A coordinate system is defined on a mask 1 surface, such as shown in FIG. 8. The origin is at the middle of the width of the scribe line, the x axis is in the direction of the scribe line, the y axis is in the widthwise direction and the z axis is in the direction of the normal of the mask 1 surface. Equations regarding a group of curved lines of such a grating lens by which a parallel light, having been incident thereon with an angle $\alpha$ with respect to the normal of the wafer surface and with the projection being perpendicular to the scribe line direction, is imaged after being reflectively diffracted by the grating lens 4a, at the position of a converging point $(x_1, y_1, z_1)$, can be expressed in the following manner, with the contour position of each grating line being denoted by x and y:

$$y \sin\alpha + P1(x,y) - P2 = m\lambda/2 \qquad (1)$$

$$P1(x,y) = \sqrt{(x - x_1)^2 + (y - y_1)^2 + z_1^2}$$

$$P2 = \sqrt{x_1^2 + y_1^2 + z_1^2}$$

wherein $\lambda$ is the wavelength of the alignment light and m is an integral number.

Assuming now that a chief ray is such a ray being incident with an angle $\alpha$ and passing through the origin on the mask surface and then impinging upon a convergent point $(x_1, y_1, z_1)$, then the right side of equation (1) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point $(x, y, 0)$ on the mask and then impinges on the point $(x_1, y_1, z_1)$.

On the other hand, a grating lens 3 to be provided on a wafer 2 can be designed so as to collect, at a predetermined position (on the sensor surface), a spherical wave emanating from a predetermined point light source. Where the gap between a mask 1 and a wafer 2 at the time of exposure (pattern transfer) is denoted by g, then such a point light source can be expressed by:

$$(x_1, y_1, z_1 - g)$$

Assuming now that the mask 1 and the wafer 2 are to be aligned with respect to the y-axis direction and that, upon completion of alignment, the alignment light is focused at a point $(x_2, y_2, z_2)$ on the sensor surface, then equations regarding a group of curved lines of a grating lens of a mask can be expressed, in the coordinate system defined hereinbefore, as follows:

$$\sqrt{(x - x_2)^2 + (y - y_2)^2 + z_2^2} - \qquad (2)$$

$$\sqrt{(x - x_1)^2 + (y - y_1)^2 + (z_1 - g)^2} =$$

$$\sqrt{x_2^2 + y_2^2 + z_2^2} - \sqrt{x_1^2 + y_1^2 + z_1^2}$$

Equation (2) is such an equation that satisfies a condition by which, assuming that the mask surface is "z= −g" and that the chief ray is such a ray that passes the origin on the wafer surface and a point (0, 0, −g) on the mask surface and additionally a point ($z_2$, $y_2$, $z_2$) on the sensor surface, the difference in length between the path of the chief ray and the path of a ray passing the grating lens (x, y, −g) on the wafer surface becomes equal to a multiple, by an integral number, of a half wavelength.

Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern having a rectangular section, for example. The fact that, in equations (1) and (2), each grating line (ring) is defined at a position which corresponds to a multiple, by an integral number, of a half wavelength with regard to the chief ray, means that the linewidth ratio of the transparent portion and the light blocking portion is 1:1 in the case of the grating lens 3a on a mask, and that the line and space ratio of rectangular grating is 1:1 in the case of the grating lens 4a on the wafer.

As a specific example, a grating lens 3a on a mask was formed by transferring, onto an organic thin film of polyimide, a grating lens pattern of a reticle prepared by use of electron beam exposure technique.

On the other hand, a grating lens on a wafer was formed by preparing on a mask a pattern to be printed on a wafer and then by transferring the pattern by use of a lithographic process.

Figure 9A:
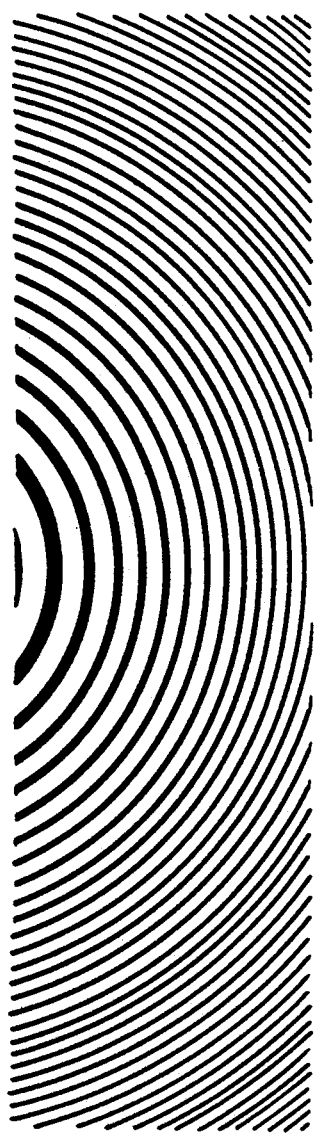
FIGS. 9A and 9B are representations exemplifying patterns of grating lenses usable in the present invention.
Figure 9B:
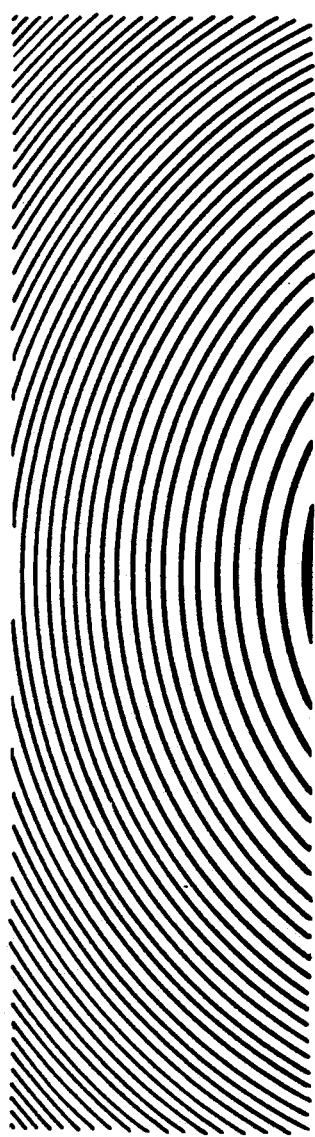

An example of a grating lens 4a to be provided on a wafer is illustrated in FIG. 9A, and an example of a grating lens 3a to be provided on a mask is illustrated in FIG. 9B.

Referring back to FIG. 4A, description will now be made of a case, in this embodiment, where a particular positional deviation is given between a mask and a wafer.

Light emanating from a semiconductor laser as an alignment light, of a wavelength 830 nm, passes through the projecting lens system 11 and is transformed into a parallel light of a half width of 600 microns. The parallel light is projected from the alignment head 6 upon the wafer 2 surface at an angle of 40 degrees with respect to the normal to the wafer 2 surface.

On a scribe line upon the mask M surface, grating lenses 3a each having a width 60 microns and a length 280 microns are formed. Also, on a scribe line upon the wafer surface, grating lenses 4a each having the same size of the grating lens 3a are formed. For a relative positional deviation between the mask and the wafer, a minute displacement is provided by the fine-motion wafer stage, driven by the piezoelectric drive, while a relatively large displacement is provided by the rough-motion wafer stage, driven by the stepping motor drive. For measurement of the displacement, a measuring machine (resolution 0.01 micron) was used and the measurement was made in a temperature controlled chamber at a controlled temperature of 23°±0.5° C. One-dimensional (linear) CCD line sensor was used as the photoreceptor, in the alignment head 6, for detecting the position of the center of gravity of light. The line sensor was disposed so that the direction in which its sensing elements were arrayed was correlated with the direction with respect to which any positional deviation was to be detected. Output signals from the line sensor are processed so as to be standardized with respect to the total light intensity in the whole light receiving region. This assures that, even if the output power of the alignment light source changes slightly, the measured value as obtainable from the line sensor system correctly represents the position of center of gravity.

The resolution of such a line sensor for the position of the center of gravity may depend on the power of the alignment light used. When the measurement was made by using a semiconductor laser of 50 mW, the result was 0.2 micron.

In a design example of a mask grating lens 3a and a wafer grating lens 4a in accordance with the first embodiment, the grating lenses are so set that the position of the center of gravity of a signal light is displaceable upon a sensor surface while magnifying by ×100 a positional deviation between a mask and a wafer. As a consequence, a positional deviation of a magnitude 0.01 micron between a mask and a wafer causes effective displacement of the center of gravity upon the line sensor surface of an amount 1 micron, which displacement can be measured by the line sensor surface with a resolution of 0.2 micron.

FIG. 5 shows the variation in the position of center of gravity which can be detected by an alignment line sensor where a varying amount of positional deviation is actually given between a mask and a wafer. It is seen from FIG. 5 that, to the positional deviation between the mask and the wafer, the detected position of the center of gravity has a linear relationship, taking the magnification of the grating lens system as a proportional constant. If, however, the positional deviation goes beyond a certain value (about 20 microns), the linearity is destroyed and a non-linear relationship appears.

This is because of the fact that the wavefront aberration of light grows with an increase in the amount of deviation between the optical axes of the grating lenses of the mask and the wafer and, as a result, asymmetry appears in the configuration of the light spot on the sensor.

The wavefront aberration is larger with a larger numerical aperture (NA) of a grating lens. Therefore, preferably a smaller NA is used when a grating lens is set in a particular area.

An alignment system structured in accordance with the present embodiment assures a resolution of 0.002 micron for the positional deviation and a deviation measuring range of ±20 microns (linear relationship region).

Since in this embodiment light is projected inclinedly upon a mask surface and, additionally, an inclined path is set for reception of light, any positional deviation between a mask and a wafer can be measured without protruding the alignment head 6 into the exposure region. As a result, it is not necessary to move the alignment head 6 before and after the exposure. Thus, where the present embodiment is applied to a step-and-repeat type exposure system, the total throughput can be improved by about 20%. Also, it has been confirmed that, as compared with such a system in which an alignment head is moved before and after the exposure, the overlay accuracy can be improved by about 0.02 micron.

In this embodiment, the wafer alignment pattern (grating lens) 4a is so designed that the light reflectively diffracted by this grating lens goes to the mask grating lens 3a substantially perpendicularly to the mask surface (wafer surface), namely, along a path substantially perpendicular to the mask or wafer surface. In other words, the path of light between the wafer and the mask is set to be included (i) in a plane (e.g. x-z plane) which is perpendicular to the direction (e.g. y-axis direction) with respect to which any relative positional deviation of the mask and the wafer is to be detected, and also (ii) in a plane (e.g. y-z plane) which is perpendicular to the mask or wafer surface (e.g. in x-y plane) and which contains the said direction with respect to which the deviation should be detected.

This is very effective to prevent deterioration of alignment accuracies due to any variation in the gap or spacing between the mask and the wafer, because any such variation does not cause shift of the position of incidence of the light, from the wafer grating lens, upon the mask grating lens.

As the parallel light from the alignment head passes the mask toward the wafer grating lens, the light goes through such a flat portion of the mask surface on which no alignment pattern is provided, and then it is incident on the wafer grating lens. Therefore, the intensity distribution of the light is not disturbed by the mask surface. As a result, upon the sensor surface, a good and symmetrical point image distribution can be formed with certainty by the alignment light.

Further, in this embodiment, the alignment mark on the wafer is illuminated by a parallel light having a cross-sectional area larger than the area of the mark. As a result, even if the wafer shifts slightly in a vertical direction so that the position of the light incident upon the wafer changes slightly, the whole surface of the mark can be irradiated with a parallel light and, as a consequence, the position of the center of gravity of light from the wafer alignment mark to a mask alignment mark is unchangeable. By this feature, it is possible to ensure a positional deviation detecting system in which the measurement precision is not affected by vertical displacement of a wafer.

Figure 10:
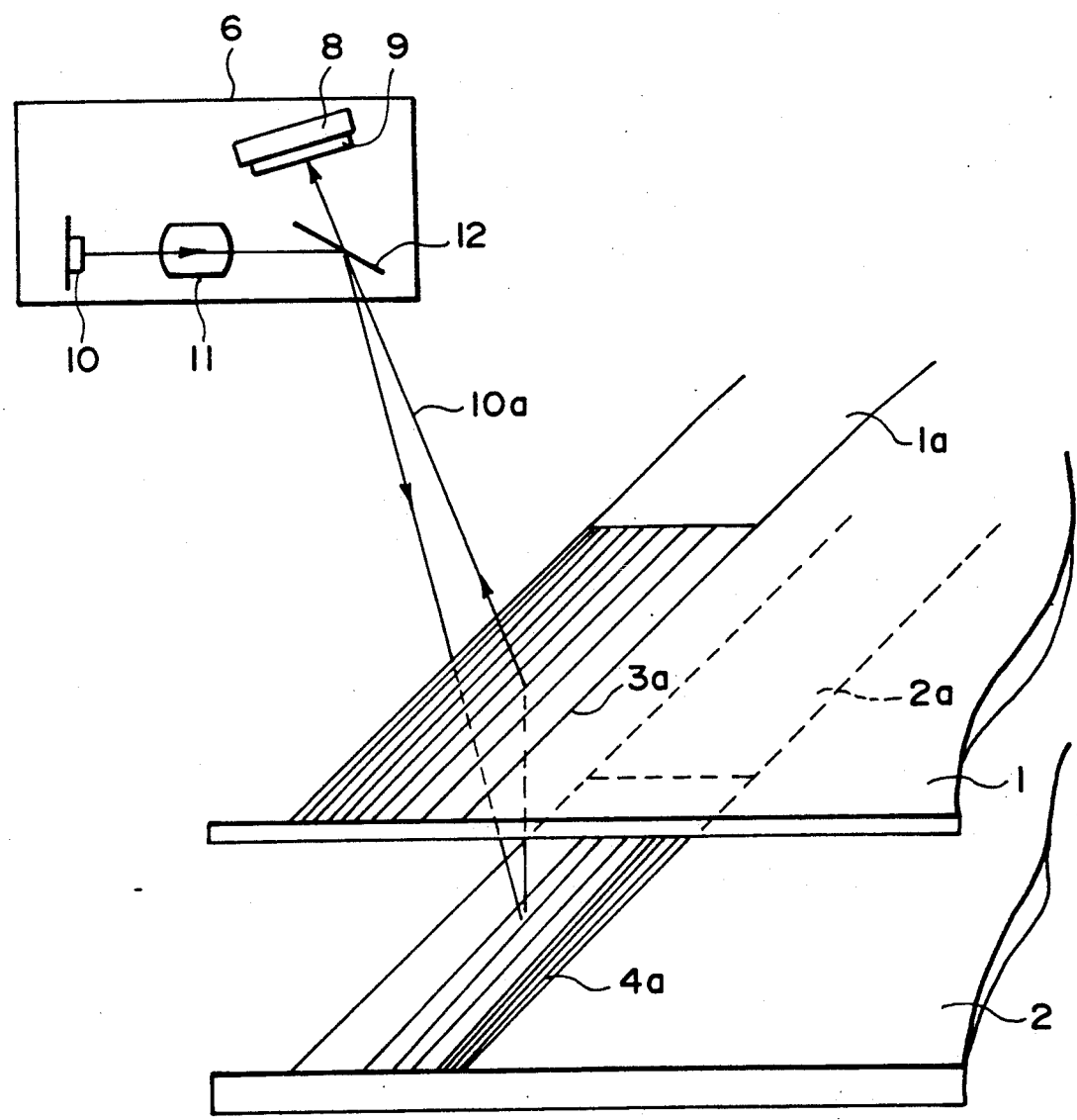
FIG. 10 is a schematic illustration of a position detecting device according to a second embodiment of the present invention.

FIG. 10 is a schematic view of a second embodiment of the present invention. In this illustration, for better understanding, only a portion in the neighborhood of a mask 1 and a wafer 2 is depicted in perspective. In this embodiment, alignment patterns 3a and 4a provided on the mask 1 and the wafer 2 each is formed by a one-dimensional grating lens. Thus, in this or second embodiment, the mask and the wafer can be aligned with each other with respect to the widthwise direction of a scribe line 1a or 2a along which direction each alignment pattern is formed. The remaining portion is substantially the same as the first embodiment.

In this embodiment, similarly, alignment light 10a is projected from an alignment head 6 along a path inclined with respect to the normal to the wafer 2 surface, and then is reflected by the alignment pattern 4a on the wafer 2 surface. Thereafter, the reflected light passes the grating lens 3a on the mask 1 surface and goes back to the alignment head 6. It is to be noted that, at this time, the path of light being reflectively diffracted by the grating lens 4a of the wafer and being incident on the grating lens 3a of the mask, is perpendicular to the mask surface or wafer surface. As a result, any variation in the gap between the mask and the wafer due to any vertical displacement of the wafer does not cause shift of the center of gravity of light upon the sensor surface, as in the first embodiment.

As one feature of this embodiment, each of the grating lenses 3a and 4a has a power (lens function) only in the widthwise direction of the scribe line. As a result, the grating lens can be formed by a simple structure having a pattern of straight gratings. Accordingly, as compared with use of a curved-line grating, the pattern drawing precision may be loosened slightly. This is particularly advantageous in a case where an electron beam pattern drawing apparatus is used for the drawing of alignment patterns.

In this embodiment, even if a wafer is displaced relatively to a mask in a direction perpendicular to the alignment direction with respect to which a positional error is to be detected by a combination of an alignment pattern and a corresponding photoreceptor in an alignment head, there is no magnification sensitivity for the light upon the detecting surface of the photoreceptor in that direction perpendicular to the alignment direction and, as a result, there does not occur a large displacement of the center of gravity. Thus, where for measurement of positional deviation a one-dimensional sensor is used with a grating lens having no lens function with respect to a direction perpendicular to the alignment direction (with respect to which the alignment is to be detected), as in the second embodiment, it is possible to assure position measurement which is completely free from the effect of any relative positional deviation between the mask and the wafer in the direction perpendicular to the alignment direction.

In the second embodiment, the angle of incidence of the alignment light and the power of each grating lens with respect to the alignment direction as well as the size of the pattern, are set in the same manner as in the first embodiment. As a result, the second embodiment shows substantially the same characteristics (e.g. magnification sensitivity and linearity) with respect to the detection of a positional deviation between a mask and a wafer in the alignment direction. Also, the total throughput of the exposure system (of step-and-repeat type) can be improved similarly by about 20%, and the overlay accuracy can be improved by about 0.02 micron, as compared with such an system where the head is moved before and after the exposure.

Figure 11:
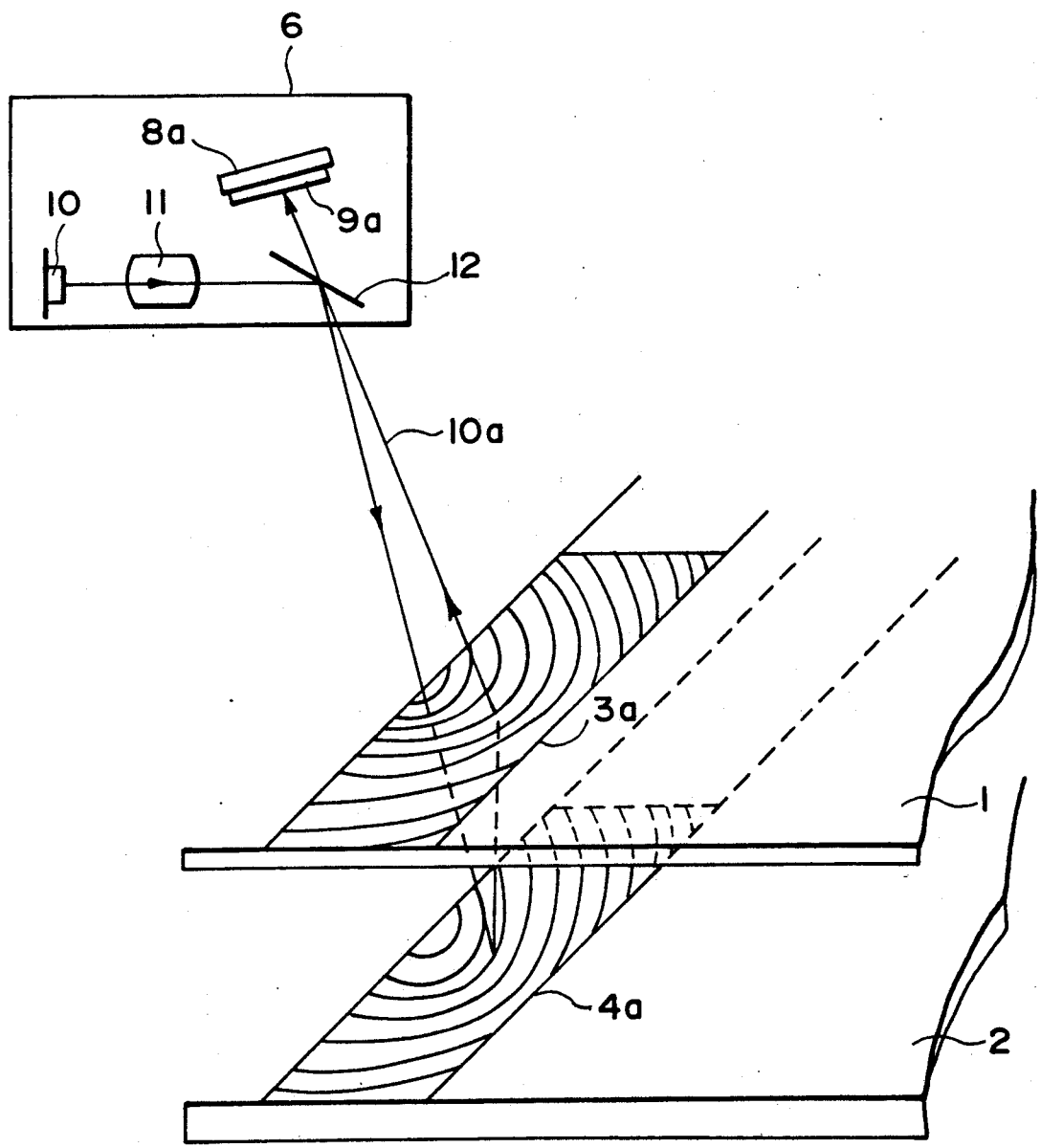
FIG. 11 is a schematic illustration of a position detecting device according to a third embodiment of the present invention.

FIG. 11 schematically illustrates a third embodiment of the present invention. Similarly, in FIG. 11, only a portion in the neighborhood of a mask and a wafer is illustrated in a perspective. In this embodiment, a grating lens 3a of a mask and a grating lens 4a of a wafer each is formed by a two-dimensional grating lens having the same power with respect to the lengthwise direction of a scribe line and a direction (widthwise direction) perpendicular thereto.

Similarly to the first and second embodiments, alignment light 10a is projected from an alignment head 6 along a path inclined with respect to the normal to a wafer 2 surface, and an alignment pattern is so set that the optical path from the wafer to the mask is perpendicular to the mask surface (wafer surface). The alignment light 10a is reflected by the grating lens 4a on the wafer 2 surface and, thereafter, it passes the grating lens 3a on the mask 1 surface and goes back to the alignment head 6. Finally, it impinges on a detecting surface 9a of a two-dimensional sensor 8a. In response, the two-dimensional sensor 8a detects the position of the center of gravity of the received light.

It will be understood that in this embodiment, with the two-dimensional sensor 8a, any positional deviation between the mask and the wafer is detected two-dimensionally at a magnification as determined by the grating lens system. By using such a two-dimensional grating lens and such a two-dimensional sensor in the described manner, the direction and magnitude of the positional deviation between the mask and the wafer can be detected correctly and at the same time. In the sensor system, as in the first embodiment, signals are processed so as to be standardized with respect to the total light intensity over the whole light receiving region. Therefore, even when the output power of a light source changes slightly, the measured value as obtainable from the sensor system correctly represents the position of the center of gravity.

The angle of incidence of the alignment light and the power and size of each of the grating lenses 3a and 4a are set in the same way as in the first embodiment. As a consequence, substantially the same position detecting characteristics as in the first or second embodiment are assured. It is to be noted here that the signal processing in the sensor system is so made as to detect the position of the center of gravity in a two-dimensional light intensity distribution and, therefore, there is a slight difference in respect to the processing time and the algorithm.

Figure 12:
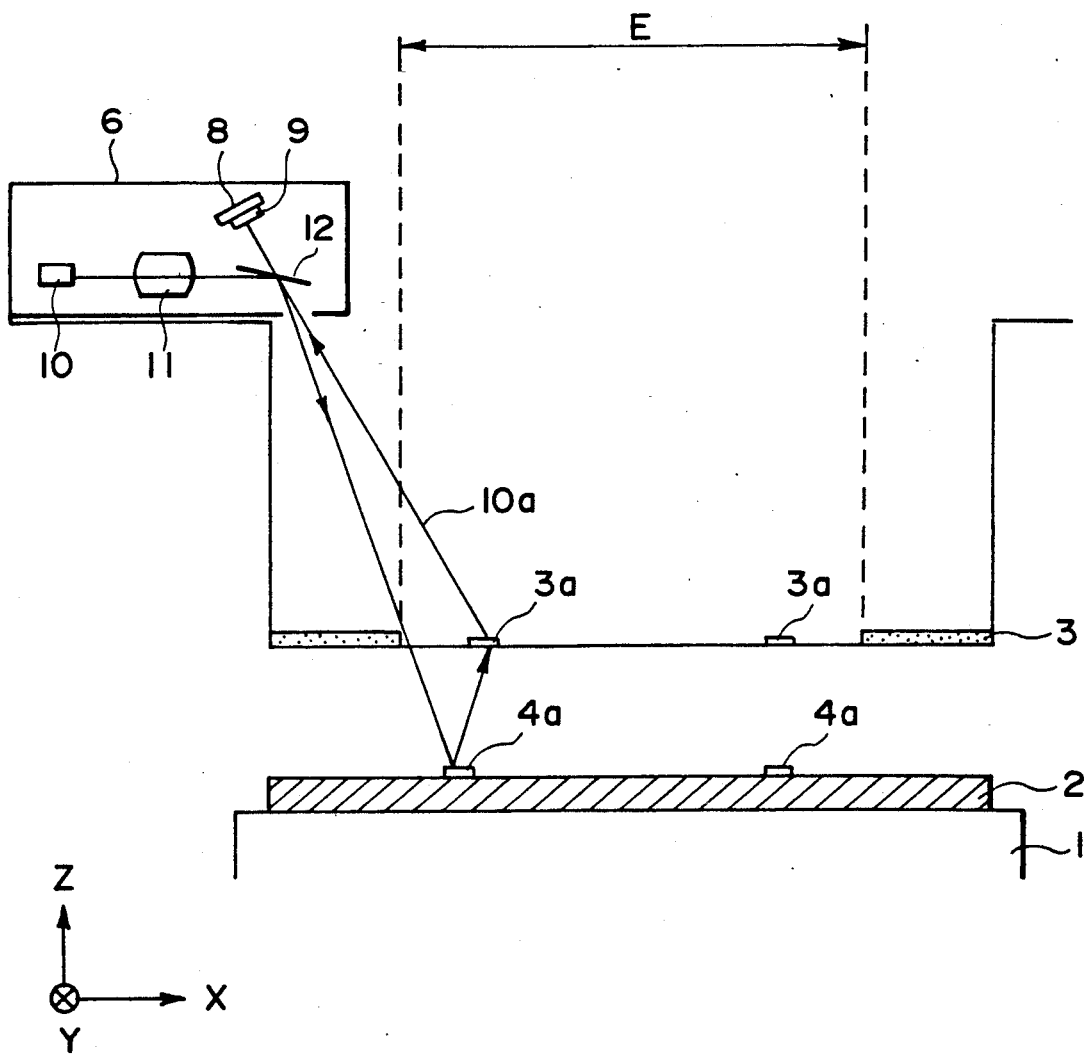
FIG. 12 is a schematic illustration of a fourth embodiment of the present invention.

FIG. 12 illustrates a fourth embodiment of the present invention.

In this embodiment, upon an off-axis type grating lens element 4a formed on a wafer 2, a light 10a from a light source is projected at a predetermined angle $\theta_1$ (e.g. 15 degrees) with respect to a normal to the wafer surface. The light is influenced by a lens function of the wafer grating lens element 4a and is reflectively diffracted thereby. Of those light rays diffracted by the grating lens element 4a, an alignment signal light to be used for the detection of any positional deviation between the mask and a wafer is such a light that advances in a direction perpendicular to a direction with respect to which the positional deviation between the mask and the wafer should be detected by a photoreceptor 8 accommodated in an alignment head (optical pickup) 6.

If, for example, in this embodiment the direction with respect to which a positional deviation should be detected is set in the lengthwise direction of a scribe line on the mask 3 or wafer 2 (i.e. the y-axis direction in FIG. 12), only it is necessary for the alignment signal light, emanating from the wafer grating lens element 4a, to advance in a direction perpendicular to the scribe line direction.

If such a condition is satisfied, any change in the spacing between the mask 3 and the wafer 2 in the Z-axis direction does not cause shift, upon the photodetector in the alignment head 6, of the position of the center of gravity of the alignment signal light having emanated from the wafer grating element 4a and having passed the mask grating element 3a, in the direction with respect to which any relative positional deviation is to be detected through the grating lens system. This is also the case with the third embodiment.

Structural difference between the fourth embodiment and the third embodiment lies in that the optical path of the alignment signal light, after passage through the wafer grating lens 4a, is perpendicular to the mask surface or wafer surface in the third embodiment, whereas in the fourth embodiment it is not perpendicular to the mask surface or the wafer surface but is perpendicular only to the direction (e.g. y direction in FIG. 12) with respect to which any positional deviation between the mask and the wafer is to be detected. In other words, the path of light from the wafer grating lens 4a is contained in a plane (e.g. x-z plane) which is perpendicular to the direction (e.g. y-axis direction) with respect to which any relative positional deviation between the mask and the wafer is to be detected.

On the other hand, similarly to the third embodiment, the fourth embodiment is so structured that the direction of advancement (optical path) of the alignment signal light 10a having been reflectively diffracted by the lens function of the wafer grating lens 4a is perpendicular to the direction with respect to which any positional deviation between the mask and the wafer is to be detected, even after the light is diffracted by the grating lens element 3a. However, when the invention is actually embodied, it is not necessary as in the second embodiment that the alignment signal light having been influenced by the lens function of the grating lens elements 3a and 4a and emanating from the mask 3 goes along an optical path perpendicular to the direction with respect to which the positional deviation should be detected.

Figure 13A:
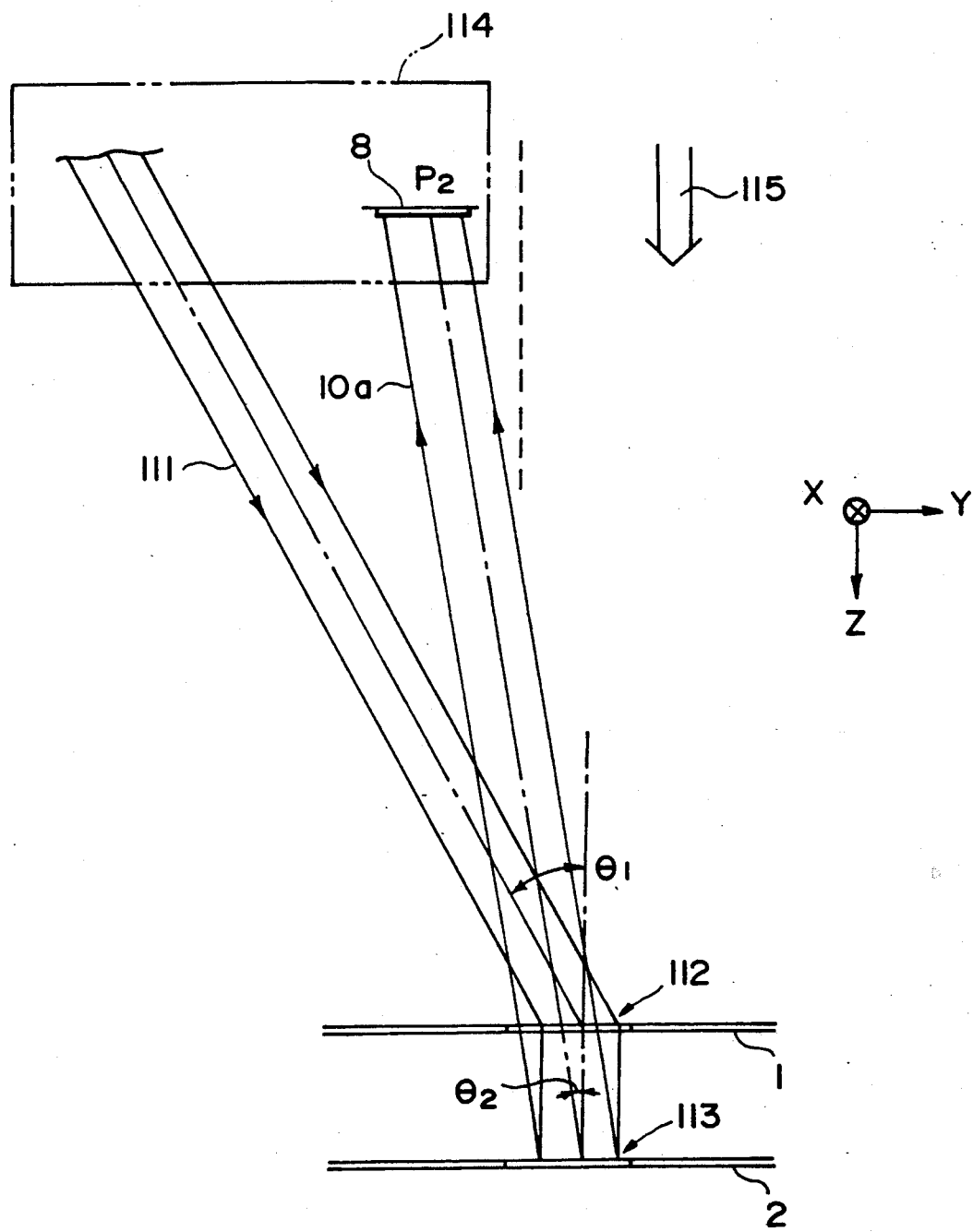
Figure 13B:
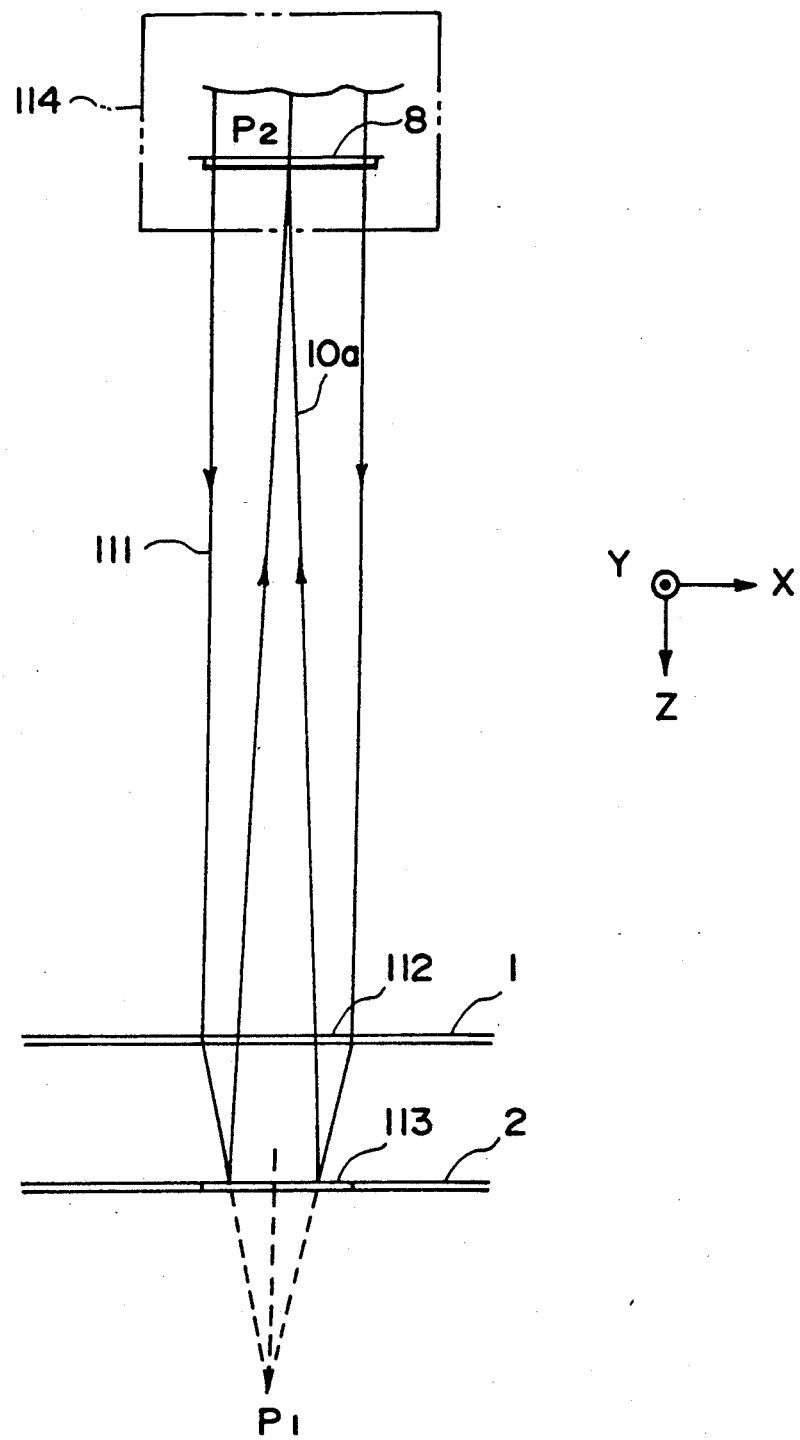

FIGS. 13A and 13B are a side view and a front view, respectively, schematically showing a major portion of a fifth embodiment of the present invention. In this embodiment, any positional deviation between a mask 1 (first object) and a wafer 2 (second object) in the plane of the sheet of FIG. 13B can be detected.

Light 111 from a light source is incident on a first off-axis type grating element (grating lens) 112 provided on a mask 1, at an angle $\theta_1$ with respect to a normal to the mask 1 surface. Diffraction light of a predetermined order from the grating element 112, caused thereby, emanates from the mask 1 perpendicularly thereto, and it is incident on a second off-axis type grating element 113 provided on a wafer 2 surface.

An off-axis type grating element is such an element that, when light is incident thereupon with an arbitrary inclination angle with respect to a normal to the surface forming that element, its property is assured with respect to light of a particular order or orders, other than the order of specularly reflected light or rectilinearly transmitted light.

The first off-axis type grating element 112 is provided by a zone plate having a chief ray advancing substantially in the direction of the normal to the mask 1 and a finite focal length in the plane of the sheet of FIG. 13B, so that it can form a one-dimensional image not focused in the plane of the sheet of FIG. 13A.

On the other hand, the grating element 113 is provided by such a zone plate as having an object point coincide with the one-dimensional image formed by the mask 1 and as having an inclination angle $\theta_2$ in the sheet of FIG. 13A with respect to the normal to the wafer 2, for forming an image upon a photosensor 8 surface. Reference numeral 10a denotes such a light as received thereby. Denoted generally at 114 is an optical pickup casing (alignment head) which emits the light 111 and accommodates therein the photosensor 8. Reference numeral 115 denotes a printing light to be used for transferring a pattern of the mask 1 onto the wafer 2. Chain line in FIG. 13A depicts the boundary of the optical path for the printing light. As for such printing light, a ultraviolet ray or an X ray are usable, for example.

If, in this embodiment, the wafer 2 displaces laterally in the X direction (in which deviation is to be detected), the illuminance distribution on the photoreceptor 8 displaces laterally in the sheet of FIG. 13B, as described. The off-axis type grating elements 112 and 113 are set in the following manner.

That is, as for the first off-axis type grating element 112, where a coordinate system as illustrated is set and where the origin is set at the center of the grating element 112, then the pattern of this grating element 112 can be given by the following equations:

$$Y\sin\theta_1 + P_1(X) - P_2 = m\lambda/2$$

$$P_1(X) = [(X-X_1)^2 + Z_1^2]^{\frac{1}{2}}$$

$$P_2 = [(X_1^2 + Z_1^2)]^{\frac{1}{2}}$$

wherein $\lambda$ is the wavelength of the light 111 and m is an arbitrary integral number. Character $P_2$ denotes the distance from the origin to the point of convergence of the grating element 112, and character $Z_1$ denotes in a physical sense a focal length of the grating 112.

On the other hand, the second grating element 113 is set in a similar way. If a set distance between the mask 1 and the wafer 2 is g, since the object point to the grating element 113 is $(x_1, y, z-g)$, in the coordinate system set forth above it follows that:

$$[(X - X_2)^2 + Z_2^2]^{\frac{1}{2}} - [(X - X_1)^2 + (Z_1 - g)^2]^{\frac{1}{2}} + Y\sin\theta_2 = [X_2^2 + Z_2^2]^{\frac{1}{2}} - [X_1^2 + Z_1^2]^{\frac{1}{2}} + m\lambda/2$$

Here, the coordinate of the image point $P_2$ on the photodetector 8 as there is no positional error is taken as $(X_2, Y, Z_2)$.

As for these angles $\theta_1$ and $\theta_2$, it is necessary that they are so determined that the pickup casing 114 can be set at the position outside of the path of the printing light. Also, in consideration of practical dimensional conditions, the angles $\theta_1$ and $\theta_2$ should have a difference not less than 3 degrees. However, if $\theta_1$ and $\theta_2$ are large, the linewidth of the pattern of the grating element decreases which results in a greater difficulty in fabricating and a decreased diffraction efficiency. Particularly, the latter causes reduction in the quantity of light impinging on the photodetector 8 and, therefore, it results in deteriorated accuracies. In consideration of the above, practically it is desirable to set an angle not greater than 30 degrees.

For ensuring detection of the signal light upon the photodetector 8 with a good-to-noise ratio, it is necessary that the same is sufficiently separated from the alignment light projected from the alignment head. Thus, it is preferable to set the angles $\theta_1$ and $\theta_2$ to have a difference not less than 3 degrees.

As for the light source providing the alignment light, those light sources which can emit a monochromatic light or a semi-monochromatic light are usable, in consideration of the characteristics of the grating element. For example, a laser light source or a light emitting diode are usable. Particularly, in respect to the applicability of a semiconductor device manufacturing exposure apparatus, use of a semiconductor laser is preferable because of its high luminance, smallness in size or otherwise.

Since an exposure region is usually of a rectangular shape, four optical pickup casings each as described above may be provided each for one side of the four sides, so as to allow that with respect to the orthogonal axes X and Y the four pickup devices produce signals concerning the components $\Delta X_1$, $\Delta X_2$, $\Delta Y_1$ and $\Delta Y_2$ of the positional deviation between a mask and a wafer. In that case, by using the positions of the grating elements which are predetermined, the information necessary for effecting the overall alignment is obtainable. While each pickup needs an appropriate drive mechanism to follow any shift of the position of associated grating elements, the throughput for the manufacture of semiconductor circuits, the mechanical reliability and the service life of the apparatus can still be improved significantly because there is no necessity of retracting the pickup devices at the time of exposure.

While the foregoing embodiments have been described with reference to those examples in which a mask and a wafer are aligned with each other, the invention is applicable in a similar way to a device for detecting the information concerning the distance between a mask and a wafer.

More specifically, in the above-described embodiment, for example, any change in the distance between the mask and the wafer causes a change in the diameter of a light spot on the photodetector 8. Thus, by detecting the spot diameter, independently of the lateral displacement, the change in the distance between the mask and the wafer can be detected.

Of the embodiments described in the foregoing, the first to fourth embodiments are generally so arranged that a projected light is first diffracted by a wafer grating lens and then is diffracted by a mask grating lens. In the fifth embodiment, on the other hand, a projected light is first diffracted by a mask grating lens and then is diffracted by a wafer grating lens. It should be however noted that the order may be reversed. For example, in FIGS. 4, 10, 11 and 12, the orientation of each arrow, depicting the optical path from the half mirror 12 through the wafer 2 and the mask 3 back to the half mirror 12, may be reversed. In that case, the inclination of the half mirror 12, the position of the detector 8 and so on, may be changed accordingly. This is also the case with the embodiment of FIG. 13.

While the invention has been described with reference to the structures disclosed herein, it is not confined to the details set forth and this application is intended to cover such modifications or changes as may come within the purposes of the improvements or the scope of the following claims.

What is claimed is:

1. A device for detecting the positional relationship between a first and second object in a predetermined direction, said first and second objects having first and second marks thereon, respectively, each having an optical power, said device comprising:

light source means for projecting light upon the first object, said light source means projecting the light obliquely so that the light incident on the first mark of the first object is deflected thereby and emanates therefrom in a direction perpendicular to said predetermined direction;

light receiving means disposed in a direction in which the light having been deflected perpendicularly to said predetermined direction and then having been deflected again by the second mark of the second object advances, said light receiving means being operable to detect the position of incident light thereupon, wherein the position of the light upon said light receiving means is changeable with the position of incident light deflected by the second object; and detecting means for detecting the positional relationship between the first and second objects in said predetermined direction, on the basis of the detection by said light receiving means.

2. A method of detecting the relative deviation of first and second objects having thereon first and second marks, respectively, wherein the second mark has an optical power and wherein a radiation beam influenced by the first and second marks is received by receiving means which detects the relative deviation of the first and second objects in a first direction, said method comprising the steps of:

projecting a radiation beam obliquely upon the first mark so that the radiation beam is deflected by the first mark in a second direction perpendicular to the first direction and is incident upon the second mark;

shifting the radiation beam deflected by the first mark with the second mark; and detecting the relative deviation of the first and second objects in the first direction in accordance with shift of the radiation beam from the first mark by the second mark.

3. A method according to claim 2, wherein the first mark has an optical power.

4. A method according to claim 2, further comprising the step of deflecting the radiation beam, deflected by the first mark, with the second mark, toward the path of projection of the radiation beam upon the first mark, to be projected in said projecting step.

5. A method of manufacturing semiconductor devices by using a mark having a circuit pattern and a first mark and a wafer having a second mark, wherein the second mark has an optical power, wherein a radiation beam influenced by the first and second marks is received by receiving means which detects the relative deviation of the mask and the wafer in a first direction, and wherein, after correction of the deviation, the circuit pattern of the mask is transferred to the wafer, said method comprising the steps of:

projecting a radiation beam obliquely upon the first mark so that the radiation beam is deflected by the first mark in a second direction perpendicular to the first direction and is incident upon the second mark;

shifting the radiation beam deflected by the first mark with the second mark; and detecting the relative deviation of the mask and the wafer in the first direction in accordance with shift of the radiation beam from the first mark by the second mark.

6. A method according to claim 5, wherein the first mark has an optical power.

7. A method according to claim 5, further comprising the step of deflecting the radiation beam with the second mark, deflected by the first mark, toward the path of projection of the radiation beam upon the first mark, to be projected in said projecting step.

8. A method of manufacturing semiconductor devices by using a mask having a circuit pattern and a first mark and a wafer having a second mark, wherein the first mark has an optical power, wherein a radiation beam influenced by the first and second marks is received by receiving means which detects the relative deviation of the mask and the wafer in a first direction, and wherein, after correction of the deviation, the circuit pattern of the mask is transferred to the wafer, said method comprising the steps of:

projecting a radiation beam obliquely upon the second mark so that the radiation beam is deflected by the second mark in a second direction perpendicular to the first direction;

shifting the radiation beam deflected by the first mark with the second mark; and detecting the relative deviation of the mask and the wafer in the first direction in accordance with shift of the radiation beam from the second mark by the first mark.

9. A method according to claim 8, wherein the second mark has an optical power.

10. A method according to claim 8, further comprising the step deflecting the radiation beam with the first mark, deflected by the second mark, toward the path of projection of the radiation beam upon the second mark, to be project in said projecting step.

11. A method of determining alignment in a predetermined alignment direction of first and second spaced apart objects, comprising the steps of:

projecting a beam of radiation onto a predetermined area of the first object and deflecting the radiation beam with the predetermined area so that the radiation beam is incident upon the second object in a direction perpendicular to the alignment direction;

deflecting the beam of radiation with the second object in a manner dependent upon the position of incidence in the alignment direction of the radiation beam on the second object; and detecting the beam deflected by the second object and determining the alignment of the two objects with the detected beam.

12. An exposure apparatus usable with a mask having a circuit pattern and a first mark and a wafer having a second mark with an optical power in a first direction, for exposing the wafer to the circuit pattern of the mask, said apparatus comprising:

means for holding the mask;

means for holding the wafer;

projecting means for projecting a radiation beam obliquely onto the first mark of the mask, such that the radiation beam is deflected in a second direction substantially perpendicular to the surface of the wafer and the deflected radiation beam is received by and reflected by the second mark of the wafer, whereby a reflected radiation beam which is shiftable in accordance with the relative position of the mask and the wafer in the first direction is produced from the wafer;

detecting means having a detection surface, for receiving the reflected radiation beam and for producing an output corresponding to the position of the reflected radiation beam upon said detection surface; and aligning means for aligning the mask and the wafer in response to the output from said detecting means.

13. An apparatus according to claim 12, wherein the first mark of the mask has an optical power in the first direction.

14. An exposure apparatus usable with a mask having a circuit pattern and a first mark with an optical power in a first direction and a wafer having a second mark, for exposing the wafer to the circuit pattern of the mask, said apparatus comprising:

means for holding the mask;

means for holding the wafer;

projecting means for projecting a radiation beam obliquely onto the second mark of the wafer, such that the radiation beam is deflected in a second direction substantially perpendicular to the surface of the mask and the deflected radiation beam is received by and transmitted through the first mark of the mask, whereby a transmitted radiation beam which is shiftable in accordance with the relative position of the mask and the wafer in the first direction is produced from the mask;

detecting means having a detection surface, for receiving the transmitted radiation beam and for producing an output corresponding to the position of the transmitted radiation beam upon said detection surface; and aligning means for aligning the mask and the wafer in response to the output from said detecting means.

15. An apparatus according to claim 14, wherein the second mark of the wafer has an optical power in said first direction.

16. A method of detecting the relative deviation of first and second objects having thereon first and second marks, respectively, wherein each of the first and second marks has an optical power and wherein a radiation beam deflected by the first and second marks is received by receiving means which detects the relative deviation of the first and second objects in a first direction, said method comprising the steps of:

projecting a radiation beam obliquely upon the first mark so that the radiation beam is deflected by the first mark in a second direction perpendicular to the first direction and is incident upon the second mark;

deflecting the radiation beam deflected by the first mark with the second mark; and detecting the relative deviation of the first and second objects in the first direction with the deflected radiation beam from the second mark.

17. A method of manufacturing semiconductor devices by using a mask having a circuit pattern and a first mark and a wafer having a second mark, wherein each of the first and second marks has an optical power, wherein a radiation beam deflected by the first and second marks is received by receiving means which detects the relative deviation of the mask and the wafer in a first direction, and wherein, after correction of the deviation, the circuit pattern of the mask is transferred to the wafer, said method comprising the steps of:

projecting a radiation beam obliquely upon the first mark so that the radiation beam is deflected by the first mark in a second direction perpendicular to the first direction and is incident upon the second mark;

deflecting the radiation beam deflected by the first mark with the second mark; and detecting the relative deviation of the mask and the wafer in the first direction with the deflected radiation beam from the second mark.

18. A method of manufacturing semiconductor devices by using a mask having a circuit pattern and a first mark and a wafer having a second mark, wherein each of the first and second marks has an optical power, wherein a radiation beam influenced by the first and second marks is received by receiving means which detects the relative deviation of the mask and the wafer in a first direction, and wherein, after correction of the deviation, the circuit pattern of the mask is transferred to the wafer, said method comprising the steps of:

projecting a radiation beam obliquely upon the second mark so that the radiation beam is deflected by the second mark in a second direction perpendicular to the first direction;

deflecting the radiation beam deflected by the first mark with the second mark; and detecting the relative deviation of the mask and the wafer in the first direction with the deflected radiation beam from the first mark.

19. A method according to claim 16, wherein said deflecting step comprises the step of deflecting the radiation beam, deflected by the first mark, with the second mark, toward the path of projection of the radiation beam upon the first mark, to be projected in said projecting step.

20. A method according to claim 17, wherein said deflecting step comprises the step of deflecting the radiation beam with the second mark, deflected by the first mark, toward the path of projection of the radiation beam upon the first mark, to be projected in said projecting step.

21. A method according to claim 18, wherein said deflecting step comprises the step of deflecting the radiation beam, deflected by the first mark, deflected by the second mark, toward the path of projection of the radiation beam upon the second mark, to be projected in said projecting step.

22. A method of determining alignment in an alignment direction of first and second spaced apart objects, comprising the steps of:

projecting a beam of radiation onto a first mark area of the first object and deflecting the radiation beam with the first mark area so that the radiation beam is incident upon a second mark area of the second object in a direction perpendicular to the alignment direction;

deflecting the beam of radiation with the second mark area in a manner dependent upon the position of incidence in the alignment direction of the radiation beam on the second object; and detecting the beam deflected by the second mark area and determining the alignment of the two objects with the detected beam.

* * * * *

UNITED STATES PATENT AND TRADEMARK OFFICE
CERTIFICATE OF CORRECTION

PATENT NO. : 5,162,656  Page 1 of 3
DATED : November 10, 1992
INVENTOR(S) : MASAKAZU MATSUGU, ET AL.

It is certified that error appears in the above-identified patent and that said Letters Patent is hereby corrected as shown below:

Title Page:
REFERENCES CITED [56]

Foreign Patent Documents
"53-1344457 11/1978 Japan" should read --53-134457 11/1978 Japan--.

COLUMN 1
Line 45, "ar" should read --are--.

COLUMN 4
Line 1, "illustrates" should read --illustrate--.
Line 47, "+z direction" should read --(+Z direction)--.
Line 59, "wafer 1" should read --wafer 2--.

COLUMN 5
Line 9, "wafer 4" should read --wafer 2--; and "z direction" should read --Z direction--.
Line 46, delete "3a".

COLUMN 6
Line 7, $\Delta\sigma = \Delta\delta \times (b/a + 1)$" should read --$\Delta\delta = \Delta\sigma \times (b/a + 1)$--.
Line 17, "first" should read --first,--.

COLUMN 7
Line 20, "example" should read --example,--.
Line 21, "no" should read --now--.

UNITED STATES PATENT AND TRADEMARK OFFICE
CERTIFICATE OF CORRECTION

PATENT NO. : 5,162,656
DATED : November 10, 1992
INVENTOR(S) : MASAKAZU MATSUGU, ET AL.

It is certified that error appears in the above-identified patent and that said Letters Patent is hereby corrected as shown below:

COLUMN 8
    Line 7, "x axis" should read --X-axis-- and "y axis" should read --Y-axis--.
    Line 8, "z axis" should read --Z-axis--.
    Line 51, "y-axis" should read --Y-axis--.

COLUMN 9
    Line 3, "$(z_2, y_2, z_2)$" should read --$(x_2, y_2, z_2)$--.

COLUMN 11
    Line 3, "x-y plane)" should read --X-Z plane)--.
    Line 4, "y-axis" should read --Y-axis--.
    Line 7, "y-z plane)" should read --Y-Z plane)--.
    Line 8, "x-y plane)" should read --X-Y plane)--.

COLUMN 13
    Line 41, "y-axis" should read --Y-axis--.
    Line 63, "y direction" should read --Y direction--.
    Line 67, "x-z plane)" should read --X-Z plane)--.
    Line 68, "y-axis" should read --Y-axis--.

COLUMN 14
    Line 59, "a" should read --an--.

UNITED STATES PATENT AND TRADEMARK OFFICE
CERTIFICATE OF CORRECTION

PATENT NO.  :   5,162,656
DATED       :   November 10, 1992
INVENTOR(S) :   MASAKAZU MATSUGU, ET AL.

It is certified that error appears in the above-identified patent and that said Letters Patent is hereby corrected as shown below:

<u>COLUMN 15</u>
Line 41, "good-to-noise ratio" should read --good signal-to-noise ratio--.

<u>COLUMN 17</u>
Line 25, "mark" (first occurrence) should read --mask--.

<u>COLUMN 18</u>
Line 8, "step" should read --step of--.
Line 11, "project" should read --projected--.

Signed and Sealed this

Twenty-second Day of February, 1994

Attest:

BRUCE LEHMAN

Attesting Officer    Commissioner of Patents and Trademarks